United States Patent [19]
Fujimoto et al.

[11] Patent Number: 5,751,030
[45] Date of Patent: May 12, 1998

[54] FIELD EFFECT TRANSISTOR

[75] Inventors: Kazuhisa Fujimoto, Kyoto; Toshinobu Matsuno, Osaka; Kaoru Inoue, Shiga, all of Japan

[73] Assignee: Matsushita Electric Industrial Co., Ltd., Osaka, Japan

[21] Appl. No.: 806,798

[22] Filed: Feb. 26, 1997

[30] Foreign Application Priority Data

Feb. 27, 1996 [JP] Japan .................................. 8-039447
Aug. 29, 1996 [JP] Japan .................................. 8-228087

[51] Int. Cl.$^6$ .............................................. H01L 31/0328
[52] U.S. Cl. .......................... 257/194; 257/190; 257/191
[58] Field of Search ................................. 257/190, 191, 257/194, 627

[56] References Cited

U.S. PATENT DOCUMENTS 5,124,762  6/1992  Childs et al. .............................. 357/16
5,404,032  4/1995  Sawada et al. .......................... 257/192

OTHER PUBLICATIONS

T. Nakatsuka et al. "A low–distortion and low–noise wide-band amplifier using GaAs/InGaAs HFET", Proc. of The Institute of Electronics, Information and Communication Engineers (IEICE), Spring Conference '93, 5–159, 1993 together with an English abridged translation.

*Primary Examiner*—Sara W. Crane
*Assistant Examiner*—Douglas A. Wille
*Attorney, Agent, or Firm*—McDermott, Will & Emery

[57] ABSTRACT

On a GaAs substrate are provided a buffer layer comprising an Undope-GaAs layer, a first n-InGaAs layer having an In composition ratio of 0.2, a second n-InGaAs layer having an In composition ratio of 0.02, a contact layer comprising an N$^+$ type GaAs layer, a gate electrode, a source electrode, and a drain electrode. The first n-InGaAs layer and the second n-InGaAs layer form active layers in which an operating current flows. The second n-InGaAs layer having excellent crystallinity is formed on the first n-InGaAs layer. Consequently, a field effect transistor which displays a super low distortion characteristic having IP2 of 67.2 dBm and IP3 of 35 dBm can be manufactured with good reproducibility.

13 Claims, 12 Drawing Sheets

RELATIONSHIP BETWEEN
CRYSTAL ORIENTATION AND
FIELD EFFECT TRANSISTOR

RELATIONSHIP BETWEEN VARIATIONS
IN STRESS AND THRESHOLD VOLTAGE

FIELD EFFECT TRANSISTOR

BACKGROUND OF THE INVENTION

The present invention relates to a semiconductor device using a compound semiconductor, and more particularly to a field effect transistor having a low distortion characteristic to be used with a microwave band.

Conventionally, since a field effect transistor using a compound semiconductor material such as GaAs has excellent amplifying and oscillating functions in a ultra high frequency region ranging from microwaves to millimetric waves, it has widely been used in an application field utilizing a high frequency signal in the ultra high frequency region. In recent years, it has been supposed that a market for the field effect transistor will expand still more in the future through diffusion of a satellite broadcast, a mobile communication telephone and the like.

In the prior art, such a field effect transistor using a compound semiconductor has been disclosed in Document 1 (A low-distortion and low-noise wide-band amplifier using GaAs/InGaAs MESFET, 1993, The Institute of Electronics, Information and Communication Engineers (IEICE), Papers of Spring Lecture, C-529), for example.

FIG. 10 is a sectional view showing a structure of an n-InGaAs/n-GaAs pseudomorphic MESFET which has been described in the Document 1. In FIG. 10, the reference numeral 51 denotes a semi-insulating GaAs substrate, the reference numeral 52 denotes an Undope-GaAs layer which acts as a buffer layer, the reference numeral 53 denotes an n-InGaAs layer which acts as an active layer, the reference numeral 54 denotes an n-GaAs layer which acts as an active layer, the reference numeral 55 denotes an $N^+$ type GaAs layer which acts as a contact layer, the reference numeral 56 denotes a gate electrode, the reference numeral 57 denotes a source electrode, and the reference numeral 58 denotes a drain electrode. This field effect transistor is characterized in that the n-GaAs layer 54 and the n-InGaAs layer 53 are provided as the active layers.

FIG. 11 shows a change characteristic of an output power Pout, a second-order intermodulation distortion IM2 and a third-order intermodulation distortion IM3 with an input Pin described in the Document 1. A second-order intercept point IP2 has a value of 59.4 dBm and a third-order intercept point IP3 has a value of 32.2 dBm, each of which represents a degree of a modulation distortion. As the values of IP2 and IP3 are increased, a distortion is low. The meaning of IP2 and IP3 will be described below.

FIG. 12 shows a relationship between a gate voltage Vgs and a transconductance gm described in the Document 1. The transconductance gm is defined by a rate of change ($\Delta Ids/\Delta Vgs$) of a drain current Ids with the gate voltage Vgs. It is supposed that a transfer characteristic is more linear when the transconductance gm has a constant value with the change of the gate voltage Vgs, that is, as dependence on the gate voltage is reduced. In general, a field effect transistor having an active layer comprising a GaAs single layer has a large gm pendency on the gate voltage Vgs. As compared with an n-GaAs layer, an n-InGaAs layer has a greater electron mobility and a greater doping level of silicon (Si) as a dopant so that a high concentration can be obtained. In a field effect transistor having such a channel structure, consequently, a magnitude of a drain current becomes greater and the transconductance gm ($\Delta Ids/\Delta Vgs$) is increased as compared with a field effect transistor having a channel formed by only a GaAs layer. As a result, operation can be performed at a higher frequency. In addition, it is possible to flatten the transconductance gm and gate-source voltage Vgs characteristic by optimizing a carrier concentration and a thickness of each of the GaAs layer and the InGaAs layer, respectively.

For example, Document 2 (M. F. Chang et.al., Appl. Phys. Lett., Vol.45, no.3, 1984, pp. 279–281) has disclosed that piezo electric charges generated in a channel region of a field effect transistor due to a stress generated between a GaAs substrate and a passivation film such as $SiO_2$ or SiN change electric characteristics, for example, a threshold voltage Vth, a transconductance gm and the like of a field effect transistor.

FIG. 13 is a diagram for defining a relationship between a crystal orientation of a GaAs substrate and an orientation of a gate electrode of a field effect transistor (which is parallel with a long side of the gate electrode) and direction of flow of a drain current. In general, a gate orientation is set perpendicular to a direction in which the drain current flows. Conventionally, a field effect transistor has often been manufactured by using a standard GaAs substrate put on the market such that a gate orientation is set to a direction [011] or [01$\underline{1}$] (an underline means "minus" which is the same as in the following) on a GaAs substrate having a principal plane (100). In the field effect transistor formed in such an orientation, electric characteristics are sometimes changed by the stress of the passivation film.

In the case where a high-frequency amplifying circuit is constructed by using a general field effect transistor formed on a compound semiconductor substrate according to the prior art, a distortion component which is not included in an input signal sometimes appears on an output signal due to non-linearity of the field effect transistor.

This distortion includes a harmonic component which is equal to n times as high as a frequency of an input signal, an intermodulation distortion generated by mutual interference of frequency components of two or more kinds of input signals, and the like. These distortion components are mainly caused by non-linearity of a transfer characteristic of an amplifying element. For this reason, a magnitude of the distortion component can almost be determined by the transfer characteristic of the amplifying element. In high-frequency operation, non-linearity of a rate of change ($\Delta C gs/\Delta Vgs$) of a gate-source capacitance Cgs with a gate-source voltage Vgs and the like are important. In other words, a distortion characteristic of a high-frequency amplifying device can almost be determined by a method for fabricating the amplifying element capable of performing linear operation.

It is desirable that these distortions (mainly, second-second-order and third-order intermodulation distortions) should be reduced as much as possible because radio interference is caused in a radio apparatus or the like, for example. In a wide-band amplifier for simultaneously amplifying multi carrier (carrier waves) at a high frequency, particularly, these distortions sometimes overlap with adjacent carriers to cause disturbance. Therefore, a field effect transistor having a super low distortion characteristic is required.

However, there has not conventionally been a field effect transistor having an ideal and excellent distortion characteristic. By forming a complicated circuit such as a push-pull circuit, the distortion characteristic of the high-frequency amplifying device has been improved.

In consideration of the above-mentioned distortion characteristic, the field effect transistors according to the prior art which have been described in the Documents 1 and 2 have the following problems.

The Document 1 has described that an n-GaAs/n-InGaAs pseudomorphic structure used for an active layer is caused to grow epitaxially by a MBE method (Molecular Beam Epitaxy method). In order to obtain excellent crystallinity, the MBE method needs epitaxial growth in which a GaAs layer has a substrate temperature of 580° C. or more and an InGaAs layer has a substrate temperature of about 470° to 530° C. when the GaAs layer is epitaxially grown on, for example, the $In_{0.20}Ga_{0.80}As$ layer whose In composition ratio is 0.2. More specifically, the n-GaAs/n-InGaAs pseudomorphic structure according to the prior art is caused to grow epitaxially as follows. An n-InGaAs layer is caused to grow epitaxially at a temperature of 470° to 530° C., the epitaxial growth is then stopped to wait for a rise in a substrate temperature and thereafter an n-GaAs layer is caused to grow epitaxially, or an n-InGaAs layer is caused to grow epitaxially at a temperature of 470° to 530° C. and the n-GaAs layer is caused to grow epitaxially without changing the substrate temperature.

In the former case, however, crystal growth is temporarily stopped. For this reason, there are problems that a complicated work is required, crystallinity of an n-GaAs/n-InGaAs interface forming the active layer is deteriorated and impurities are mixed into the interface. In the latter case, the substrate temperature in the epitaxial growth of the n-InGaAs layer has priority. Therefore, the n-GaAs layer which should originally be caused to grow at a temperature of about 580° C. is to be caused to grow at a low temperature of 470° to 530° C. For this reason, holes of Ga are increased so that the crystallinity of the n-GaAs layer is deteriorated. In other words, it is difficult to obtain an epitaxial layer having fully excellent crystallinity as the active layer of the field effect transistor even if any method is used.

Therefore, in the case where a high-frequency amplifying device is formed by using the field effect transistor fabricated by the above-mentioned method, a noise characteristic thereof is degraded, for example.

GaAs and $In_xGa_{1-x}As$ (x represents an In composition ratio) originally have different crystal lattice constants. A GaAs/$In_xGa_{1-x}As$ interface according to the prior art is in the pseudomorphic state. Accordingly, a thickness of an InxGa1-xAs layer includes a critical thickness for keeping excellent crystallinity depending on the In composition ratio x.

Furthermore, it has conventionally been known that the electric characteristic of the field effect transistor is changed by a stress generated between a GaAs substrate and a passivation film such as $SiO_2$ or SiN. The reason why such change occurs is that piezo electric charges (positive or negative) are generated in the vicinity of the active layer of the field effect transistor due to the stress caused by a difference in a coefficient of thermal expansion between a dielectric film such as $SiO_2$ or SiN and the GaAs substrate so that a carrier profile of the active layer of the field effect transistor which is formed by introducing impurities is transformed. Accordingly, the electric characteristic of the field effect transistor depends on a direction (compression or extension) or a magnitude of the stress, and has crystal orientation dependence.

FIG. 14 is a chart showing dependence, on a dielectric film thickness, of a variation in a threshold voltage of a field effect transistor formed on a GaAs substrate having a principal plane (100). An axis of abscissa indicates a thickness of a dielectric film (a passivation film) formed on the GaAs substrate, and an axis of ordinate indicates a variation in a threshold voltage Vth of the field effect transistor. An orientation of the gate electrode (see FIG. 13) is a parameter. A stress of the dielectric film is compressive. As is apparent from the chart, a shift of the threshold voltage tends to be increased when the thickness (stress) becomes greater. In the field effect transistor having the principal plane (100) and a gate orientation [01$\underline{1}$], the threshold voltage is shifted in a positive direction. On the other hand, in the field effect transistor having the principal plane (100) and a gate orientation [011], the threshold voltage is shifted in a direction reverse to the shift direction of the threshold voltage with the gate orientation [01$\underline{1}$], that is, in a negative direction. Furthermore, it is apparent that the threshold voltage of the field effect transistor having a gate orientation [010] or [001] is not varied irrespective of the stress. The reason is as follows. In an active layer region of the field effect transistor, positive piezo electric charges are generated in the gate orientation [01$\underline{1}$] and negative piezo electric charges are generated in the gate orientation [011]. On the other hand, the electric characteristic is not affected by the piezo electric charges generated in the vicinity of the active layer of the field effect transistor in the gate orientation [010] or [001].

In the field effect transistor having an excellent distortion characteristic, particularly, reproducibility (linearity) of the transfer characteristic (a Vg-Ids characteristic or the like) is important. Consequently, change of the transfer characteristic (electric characteristic) caused by such a piezo electric effect means that the distortion characteristic of the field effect transistor is considerably affected. More specifically, there has been a problem that a very high distortion characteristic cannot be obtained with good reproducibility because the electric characteristic of the field effect transistor is changed by the piezo electric effect. In addition, there has been a problem that it is hard to manufacture the field effect transistor having a super low distortion characteristic with good reproducibility.

As described above, it is difficult to obtain a practically necessary distortion characteristic by a single field effect transistor according to the prior art. For this reason, the distortion characteristic of the high-frequency amplifying device has conventionally been improved by forming a complicated circuit such as a push-pull circuit in which a plurality of field effect transistors having the same characteristics are provided to offset distortions thereof, for example.

SUMMARY OF THE INVENTION

It is a first object of the present invention to provide a field effect transistor which can independently display a distortion characteristic such as an extremely low distortion characteristic without a complicated circuit.

In addition, it is a second object of the present invention to eliminate electric property such as transmission property caused by piezo electric charges generated by stress.

The present invention provides a first field effect transistor, comprising a substrate, a buffer layer formed on the substrate by epitaxial growth, an active layer formed on the buffer layer, in which an operating current is to flow, a gate electrode formed on or above the active layer, and source/drain electrode formed in regions located at both sides of the gate electrode above the substrate and connected to both ends of the active layer. The active layer includes an n-$In_aGa_{1-a}As$ layer formed on the buffer layer and having an In composition ratio a (0<a<1), and an n-$In_bGa_{1-b}As$ layer formed on the n-$In_aGa_{1-a}As$ layer and having an In composition ratio b (0<b<a).

Preferably, the In composition ratio a of the n-$In_aGa_{1-a}As$ layer is 0.01 or more, and the In composition ratio b of the n-$In_bGa_{1-b}As$ layer is 0.25 or less.

According to the first field effect transistor, the active layer is formed by two n-InGaAs layers, that is, the n-In$_a$Ga$_{1-a}$As layer and the n-In$_b$Ga$_{1-b}$As layer. Accordingly, the n-In$_b$Ga$_{1-b}$As layer can continuously be formed on the n-In$_a$Ga$_{1-a}$As layer on almost the same conditions. The n-In$_b$Ga$_{1-b}$As layer provided on an upper layer side keeps excellent crystallinity. As a result, it is possible to obtain a high power gain, a low noise figure NF, and high IP2 and IP3, that is, a low intermodulation distortion. For example, introduction of a donor for forming n type InGaAs such as silicon (Si) can be controlled quite independently of the In composition ratio. Accordingly, a carrier profile can be fabricated optionally such that the field effect transistor displays a lower distortion characteristic (linear operation). Consequently, a degree of design freedom of the active layer can also be enhanced. The distortion characteristic of the field effect transistor can be improved together with an effect of improving non-linearity of a transconductance.

The present invention provides a second field effect transistor, comprising a semi-insulating GaAs substrate, a buffer layer formed on the semi-insulating GaAs substrate by epitaxial growth, an active layer formed on the buffer layer, in which an operating current is to flow, a gate electrode formed on or above the active layer, and source/drain electrode formed in regions located at both sides of the gate electrode above the semi-insulating GaAs substrate and connected to both ends of the active layer. The active layer is formed by three or more n-In$_x$Ga$_{1-x}$As layers, the n-In$_x$Ga$_{1-x}$As layers having In composition ratios x (0<x<1) which are different from each other such that the n-In$_x$Ga$_{1-x}$As layers located on upper sides have the In composition ratios x decreased.

Preferably, the In composition ratio x of the n-In$_x$Ga$_{1-x}$As layer is 0.01 or more and 0.25 or less.

According to the second field effect transistor, the In composition ratios of three or more n-InGaAs layers forming the active layers are decreased upward. Consequently, when forming the active layers, the crystallinity of each n-InGaAs layer can be enhanced more than in the active layer of the conventional field effect transistor. Accordingly, the distortion characteristic can be improved more than in the conventional field effect transistor.

The present invention provides a third field effect transistor, comprising a substrate, a buffer layer formed on the substrate by epitaxial growth, an active layer formed on the buffer layer, in which an operating current is to flow, a gate electrode formed on or above the active layer, and source/drain electrode formed in regions located at both sides of the gate electrode above the substrate and connected to both ends of the active layer. The active layer includes an n-In$_{aGa1-a}$As layer formed on the buffer layer and having an In composition ratio a (0<a<1), and an n-In$_x$Ga$_{1-x}$As layer formed on the n-In$_a$Ga$_{1-a}$As layer and having an In composition ratio x (0<x<a) changed to be continuously decreased upward.

Preferably, the In composition ratio a of the n-In$_a$Ga$_{1-a}$As layer is 0.01 or more, and the In composition ratio x of the n-In$_x$Ga$_{1-x}$As layer is 0.25 or less.

According to the third field effect transistor, the In composition ratio of the second n-InGaAs layer on the upper layer of the two InGaAs layers which forms the active layer is continuously decreased upward. Consequently, when forming the active layers, the crystallinity of each n-InGaAs layer can be enhanced more than in the active layer of the conventional field effect transistor. Accordingly, the distortion characteristic can be improved more than in the conventional field effect transistor.

The present invention provides a fourth field effect transistor, comprising a semi-insulating GaAs substrate, a buffer layer formed on the semi-insulating GaAs substrate by epitaxial growth, an active layer formed on the buffer layer, in which an operating current is to flow, a gate electrode formed on or above the active layer, and source/drain electrode formed in regions located at both sides of the gate electrode above the semi-insulating GaAs substrate and connected to both ends of the active layer. The active layer is formed by an n-In$_x$Ga$_{1-x}$As layer having an In composition ratio x (0<x<1) changed to be continuously decreased upward.

Preferably, the In composition ratio of the n-In$_x$Ga$_{1-x}$As layer is 0.01 or more and 0.25 or less.

According to the fourth field effect transistor, the active layer is formed by the single n-InGaAs layer, and the In composition ratio of the n-InGaAs layer is continuously decreased upward. Consequently, when forming the active layers, the crystallinity of the n-InGaAs layer can be enhanced more than in the active layer of the conventional field effect transistor. With a comparatively simple structure, accordingly, the distortion characteristic can be improved more than in the conventional field effect transistor.

The present invention provides a fifth field effect transistor, wherein a plane of the active layer which is parallel with an upper face of the substrate is a plane (100), and a direction in which the operating current flows in the active layer is a direction [010] or [001] in the first to fourth field effect transistors.

Preferably, a cross-sectional shape of the gate electrode is a rectangle having a long side and a short side, and the long side of the gate electrode is orthogonal to the direction in which the operating current flows in the active layer.

According to the fifth field effect transistor, an electric characteristic thereof can be prevented from being affected by a piezo electric effect irrespective of a stress generated between the substrate and a passivation film. While the electric characteristic of the field effect transistor has been varied by a stress of a dielectric film in the prior art, it is hardly varied by the stress according to the present invention. Thus, the field effect transistor having a super low distortion characteristic can be manufactured with good reproducibility.

DETAILED DESCRIPTION OF THE INVENTION

(First Embodiment)

Figure 1:
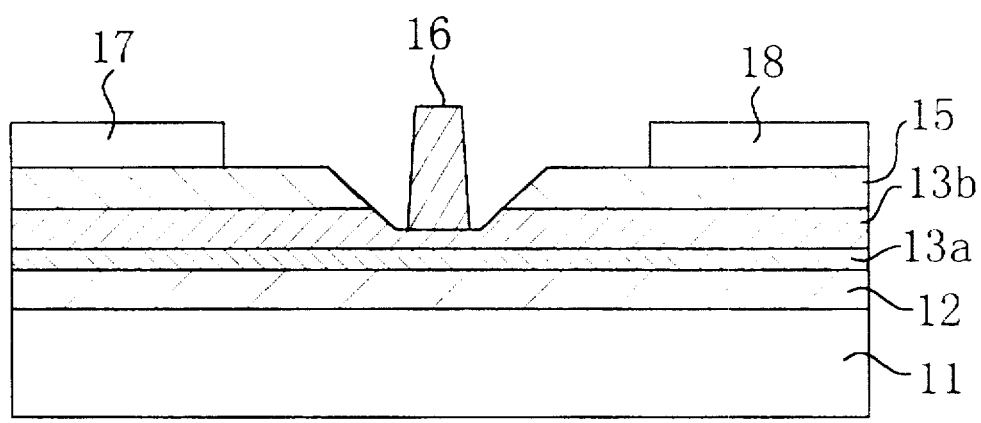
FIG. 1 is a sectional view showing a field effect transistor according to a first embodiment.

FIG. 1 is a sectional view showing a field effect transistor according to a first embodiment. In FIG. 1, the reference numeral 11 denotes a semi-insulating GaAs substrate, the reference numeral 12 denotes an Undope-GaAs layer having a thickness of 700 nm as a buffer layer, the reference numeral 13a denotes a first n-InGaAs layer having a carrier concentration of $8 \times 10^{17}$ cm$^{-3}$, a thickness of 10 nm and an In composition ratio of 0.2, and the reference numeral 13b denotes a second n-InGaAs layer having a carrier concentration of $5 \times 10^{17}$ cm$^{-3}$, a thickness of 60 nm and an In composition ratio of 0.02. The first and second n-InGaAs layers 13a and 13b form active layers in which an operating current flows. The reference numeral 15 denotes an n$^+$ type GaAs layer having a carrier concentration of about $4 \times 10^{18}$ cm$^{-3}$ and a thickness of 50 nm as a contact layer, the reference numeral 16 denotes a gate electrode, the reference numeral 17 denotes a source electrode, and the reference numeral 18 denotes a drain electrode.

The field effect transistor according to the present embodiment is characterized in that the first n-InGaAs layer 13a having an In composition ratio of 0.2 and the second n-InGaAs layer 13b having an In composition ratio of 0.02 are provided as the active layers.

Figure 5:
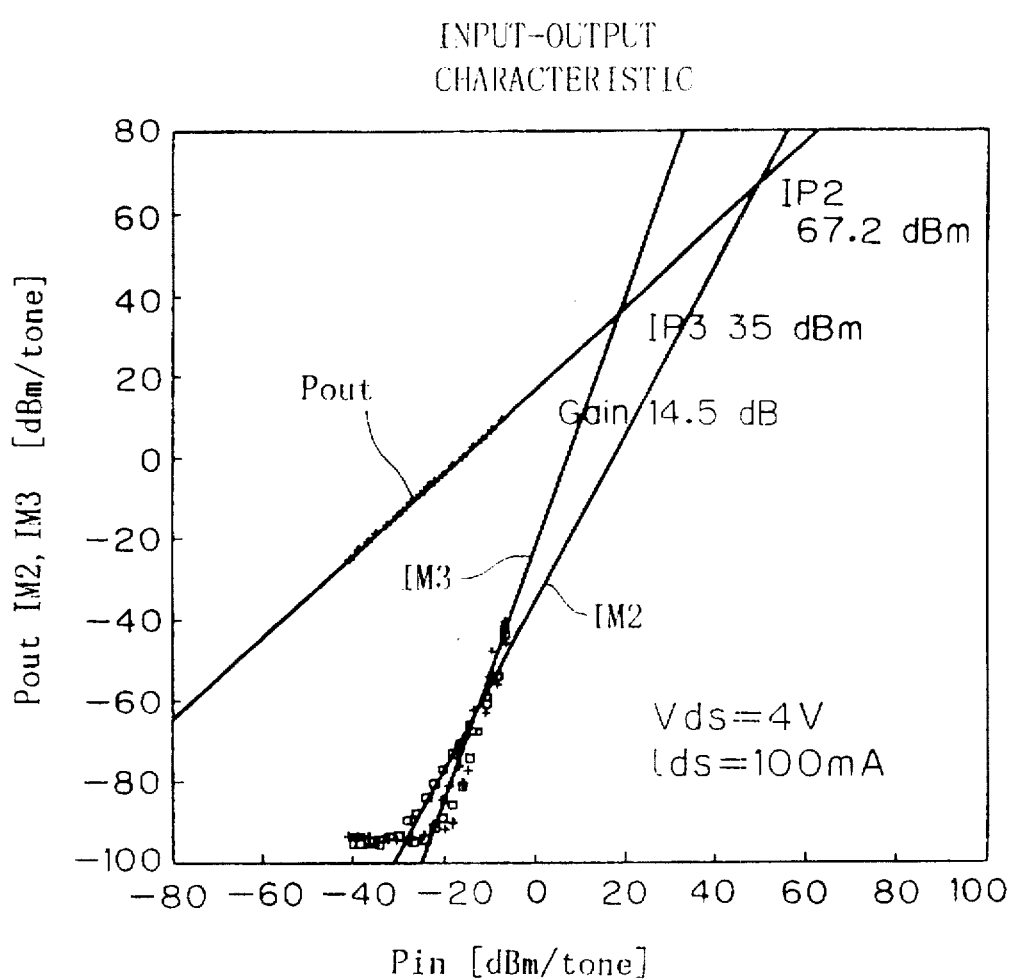
FIG. 5 is a chart showing a distortion characteristic of the field effect transistor according to the first embodiment.
Figure 8:
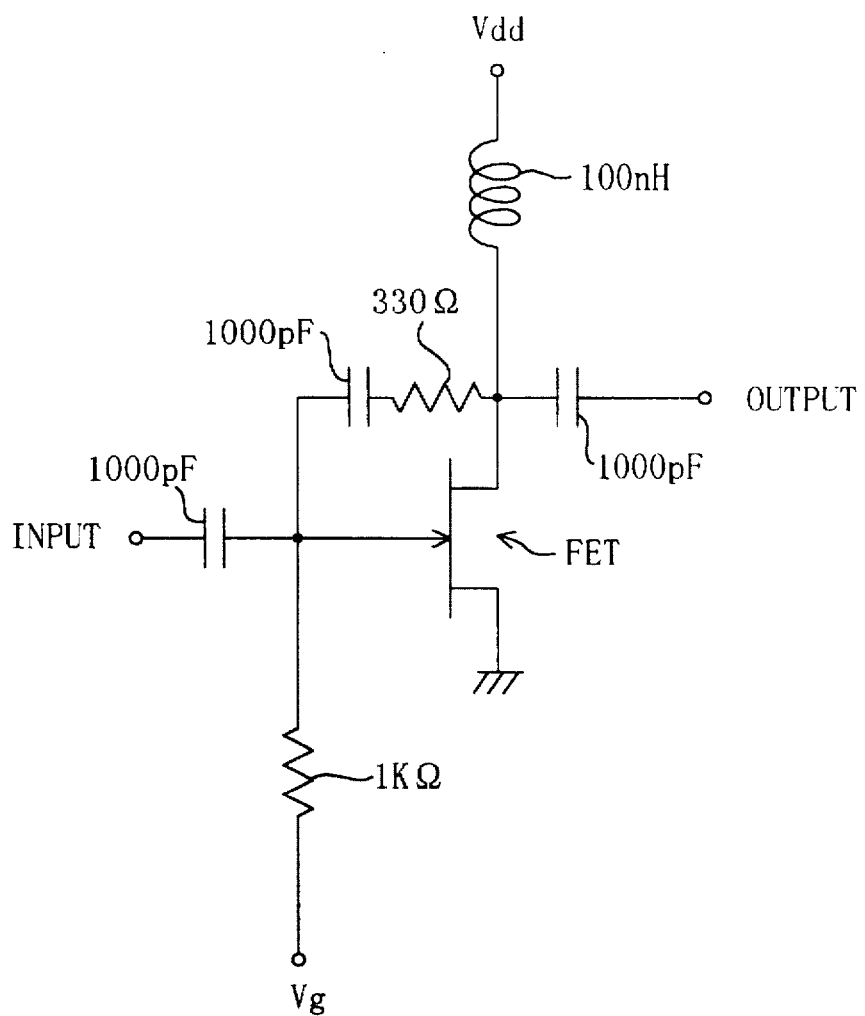
FIG. 8 is a diagram showing a structure of a negative feedback circuit which is formed in order to obtain data shown in FIGS. 5 to 7.

FIG. 5 shows a result obtained by measuring an intermodulation distortion by a 2-tone method in a negative feedback amplifier using the field effect transistor according to the present invention. As shown in FIG. 8, the negative feedback circuit has a feedback resistance of 330Ω and a feedback capacitance of 1000 pF. In FIG. 5, Pin represents an input power (dBm) per tone, Pout represents an output power (dBm) per fundamental tone, IM2 represents a second-order intermodulation distortion, and IM3 represents a third-order intermodulation distortion.

In the case where two or more signals are input to a high-frequency amplifier, intermodulation is caused between the input signals or higher harmonics generated by non-linearity of the amplifier. Consequently, a spurious is generated on an output of the amplifier. Within a range where the amplifier operates linearly, the fundamental wave Pout of an output signal is changed at a ratio of 1:1 with the input Pin, the second-order intermodulation distortion IM2 is changed at a ratio of 1:2 with the input Pin and the third-order intermodulation distortion IM3 is changed at a ratio of 1:3 with the input Pin as shown in FIG. 5. In general, intercept points (IP2, IP3) have widely been used as standard indicative of quality of a distortion characteristic. This is represented as a theoretical power in which a level (power) of the fundamental wave Pout of the output signal is equal to that of each of the intermodulation distortions IM2 and IM3. As the intercept point has a greater value, the distortion characteristic becomes more excellent.

In the case where the field effect transistor according to the present embodiment is used as shown in FIG. 5, IP2 and IP3 have values of 67.2 dBm and 35 dBm (display of each output power) respectively which are enhanced more than in the case where IP2 and IP3 have values of 59.4 dBm and 32.2 dBm described in the Document 1. It is supposed that the reason is as follows.

In the case where the active layer including the InGaAs layer described in the Document 1 according to the prior art is to be formed, an In composition ratio generally has a value of about 0.2. As described above, in the case where n-GaAs/n-In0.2Ga0.8As used for the active layer is caused to grow epitaxially by the MBE method (Molecular Beam Epitaxy method), the MBE method needs epitaxial growth in which the GaAs layer has a substrate temperature of 580° C. or more and an In0.2Ga0.8As layer has a substrate temperature of about 470° to 530° C. in order to obtain excellent crystallinity. Accordingly, the n-GaAs/n-InGaAs pseudomorphic structure is caused to grow epitaxially as follows. The InGaAs layer is caused to grow, the growth is then stopped and thereafter the n-GaAs layer is caused to grow epitaxially, or the n-InGaAs layer is caused to grow epitaxially at the same temperature and the n-GaAs layer is caused to grow epitaxially without changing the substrate temperature. Consequently, it is supposed that the crystallinity of the n-GaAs layer is deteriorated. On the other hand, when forming the active layer in the present embodiment, the second n-InGaAs layer 13b is formed on the first n-InGaAs layer 13a. Therefore, the epitaxial growth can continuously be performed at the same time at a low temperature of about 470° to 530° C. by using a MBE device so that the crystallinity of the second InGaAs layer 13b becomes excellent. As a result, it is supposed that a super low intermodulation distortion can be realized as shown in FIG. 5 together with a characteristic that a carrier mobility is high in the n-InGaAs layer.

Figure 6:
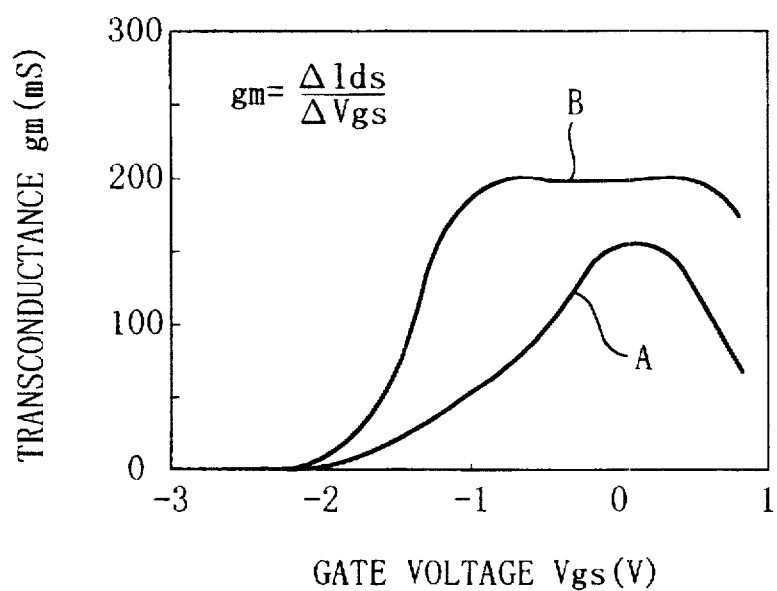
FIG. 6 is a chart showing a comparison between dependence of a transconductance gm on a gate voltage of the field effect transistor according to the first embodiment and that of a field effect transistor having a GaAs single layer structure according to the prior art.

FIG. 6 is a chart showing a comparison between dependence of a transconductance gm on a gate voltage of the field effect transistor according to the present embodiment and that of a field effect transistor having an active layer comprising a GaAs single layer according to the prior art. In FIG. 6, a curve A represents a gm characteristic of the field effect transistor having an active layer comprising a GaAs single layer formed by ion implantation, and a curve B represents a characteristic of the field effect transistor according to the present embodiment. As shown in FIG. 6, the field effect transistor according to the present embodiment has a transconductance gm and gate-source voltage Vgs characteristic which is flatter than in the field effect transistor using the GaAs single layer according to the prior art. As compared with the n-GaAs/n-InGaAs field effect transistor described in the Document 1 according to the prior art, the flat range of the transconductance gm and gate-source voltage Vgs characteristic is slightly increased. It is supposed that the reason is as follows.

More specifically, when forming the field effect transistor according to the present embodiment, introduction of a donor using silicon (Si) into the n-InGaAs layer can be controlled quite independently of the above-mentioned In composition ratio. Accordingly, the transconductance gm and gate-source voltage Vgs characteristic can be flattened more remarkably by optimizing a carrier profile (a carrier concentration distribution in a depth direction) and a thickness of the InGaAs layer. As a result, the field effect transistor having a channel structure according to the present embodiment has a higher degree of design freedom of a structure of the active layer and a much more excellent distortion characteristic than the field effect transistor having the active layer comprising n-GaAs/n-InGaAs according to the prior art.

Figure 7:
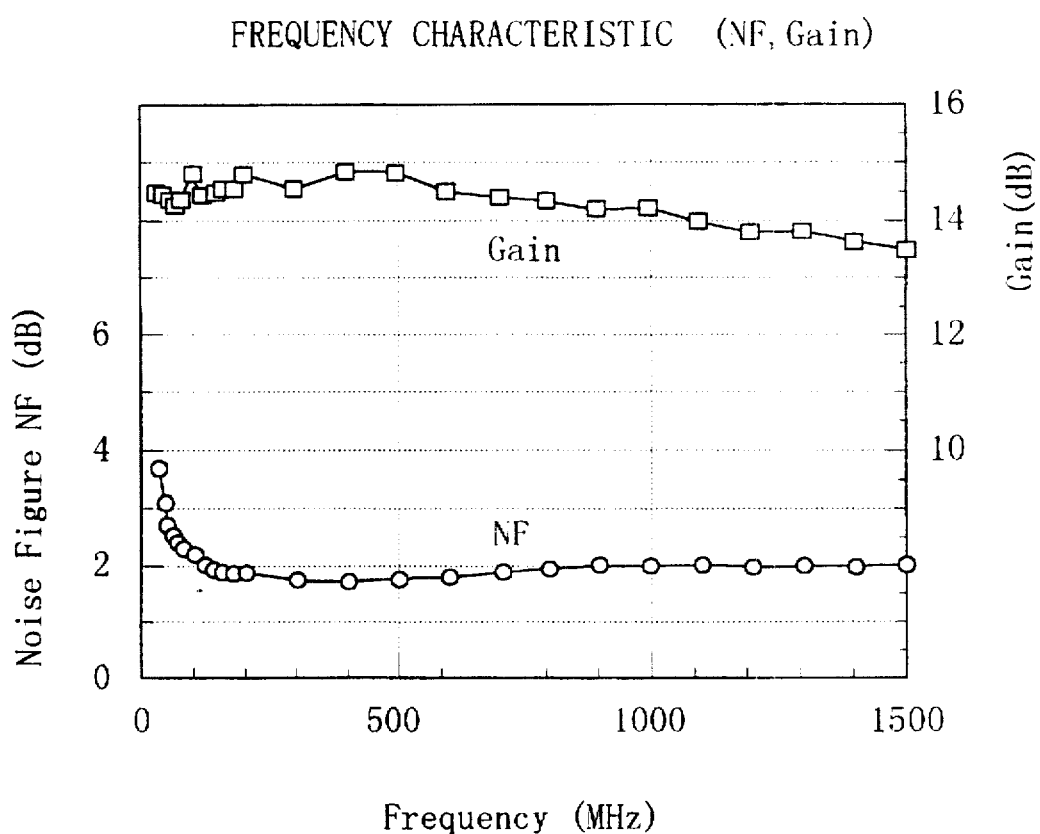
FIG. 7 is a chart showing a power gain and a noise figure NF of the field effect transistor according to the first embodiment.

FIG. 7 is a chart showing dependence, on a frequency, of a gain Gain and a noise figure NF of the field effect transistor according to the present embodiment. As shown in FIG. 7, the present embodiment realizes a high power gain of 13 dBm or more and a low noise figure NF of 2 dBm or less within a band of 1 GHz or more with a simple negative feedback circuit having a single field effect transistor provided as shown in FIG. 8. In the case where such a high power gain and such a low noise figure NF are to be realized by a field effect transistor having an active layer comprising an only n-GaAs layer, a complicated circuit such as the above-mentioned push-pull circuit should be formed. For this reason, a size of a circuit itself is increased, and manufacturing cost is also increased because a plurality of field effect transistors using expensive compound semiconductor substrates are required. On the other hand, it is apparent that a high power gain and a low noise figure NF can be obtained by the negative feedback circuit having a single field effect transistor in the present embodiment.

As described above, the field effect transistor according to the present embodiment has a super low distortion characteristic with a high gain, which cannot be realized by the field effect transistor according to the prior art. This has a very great value practically because a high power gain, a low noise figure NF and a super low composite intermodulation distortion (CSO, CTB) can be realized with a simple structure shown in FIG. 8, that is, without a complicated structure such as the push-pull circuit formed by combining a plurality of field effect transistors in a wide-band amplifier for simultaneously amplifying multi carrier (carrier waves) such as a CATV, for example.

For example, Document (GaAs IC Symposium, 1984, pp.49-52) has described that crystal defects (EPD) or dislocation can be reduced considerably or an electron mobility and a specific electric resistivity can be made remarkably uniform by adding a small amount of In (0.1 to 0.4 mol %) during crystal growth of a GaAs substrate. It is said that the reason is that In atoms serve to compensate for the dislocation generated during the crystal growth. The same effect can also be obtained in epitaxial growth performed by the MBE device. Accordingly, it is supposed that an effect of reducing the crystal defects or dislocation by addition of In described in the same Document also contributes to a very low noise characteristic of the field effect transistor obtained by the present invention.

(Second Embodiment)

Figure 2:
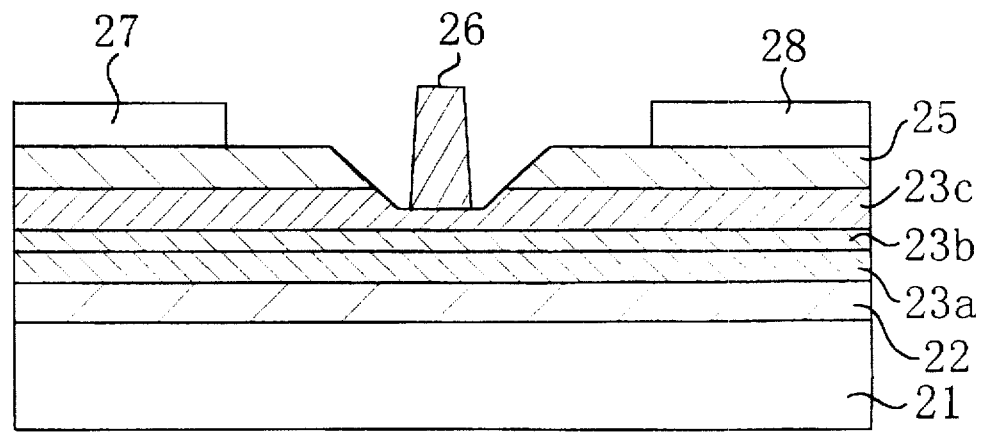
FIG. 2 is a sectional view showing a field effect transistor according to a second embodiment.

FIG. 2 is a sectional view showing a field effect transistor according to a second embodiment of the present invention. In FIG. 2, the reference numeral 21 denotes a semi-insulating GaAs substrate, the reference numeral 22 denotes an Undope-GaAs layer having a thickness of 700 nm as a buffer layer, the reference numeral 23a denotes a first n-InGaAs layer having a carrier concentration of $8 \times 10^{17}$ $cm^{-3}$, a thickness of 10 nm and an In composition ratio of 0.2, the reference numeral 23b denotes a second n-InGaAs layer having a carrier concentration of $5 \times 10^{17}$ $cm^{-3}$, a thickness of 30 nm and an In composition ratio of 0.1, and the reference numeral 23c denotes a third n-InGaAs layer having a carrier concentration of $2 \times 10^{17}$ $cm^{-3}$, a thickness of 30 nm and an In composition ratio of 0.02. The first, second and third InGaAs layers 23a, 23b and 23c form active layers. The reference numeral 25 denotes an $n^+$ type GaAs layer having a carrier concentration of about $4 \times 10^{18}$ $cm^{-3}$ and a thickness of 50 nm as a contact layer, the reference numeral 26 denotes a gate electrode, the reference numeral 27 denotes a source electrode, and the reference numeral 28 denotes a drain electrode.

The field effect transistor according to the present embodiment is characterized in that the first n-InGaAs layer 23a having an In composition ratio of 0.2, the second n-InGaAs layer 23b having an In composition ratio of 0.1 and the third n-InGaAs layer 23c having an In composition ratio of 0.02 are provided as the active layers.

According to the present embodiment, as the In composition ratios of the three n-InGaAs layers forming the active layers are decreased upward. Consequently, when forming the active layers, the crystallinity of each n-InGaAs layer can be enhanced more than in the active layers in the conventional field effect transistor.

(Third Embodiment)

Figure 3:
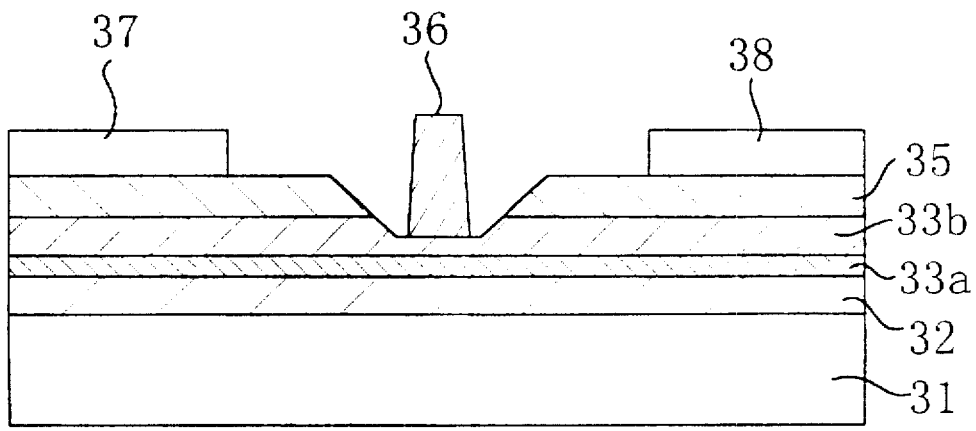
FIG. 3 is a sectional view showing a field effect transistor according to a third embodiment.

FIG. 3 is a sectional view showing a field effect transistor according to a third embodiment. In FIG. 3, the reference numeral 31 denotes a semi-insulating GaAs substrate, the reference numeral 32 denotes an Undope-GaAs layer having a thickness of 700 nm as a buffer layer, the reference numeral 33a denotes a first n-InGaAs layer having a carrier concentration of $8 \times 10^{17}$ $cm^{-3}$, a thickness of 10 nm and an In composition ratio of 0.2, and the reference numeral 33b denotes a second n-InGaAs layer having a carrier concentration of $4 \times 10^{17}$ $cm^{-3}$, a thickness of 30 nm and an In composition ratio which is continuously changed from 0.2 to 0.01 toward a surface of the substrate. The first and second n-InGaAs layers 33a and 33b form active layers. The reference numeral 35 denotes an $n^+$ type GaAs layer having a carrier concentration of about $4 \times 10^{18}$ $cm^{-3}$ and a thickness of 50 nm as a contact layer, the reference numeral 36 denotes a gate electrode, the reference numeral 37 denotes a source electrode, and the reference numeral 38 denotes a drain electrode.

The field effect transistor according to the present embodiment is characterized in that the first n-InGaAs layer 33a having an In composition ratio of 0.2 and the second n-InGaAs layer 33b having the In composition ratio which is continuously changed from 0.2 to 0.01 toward the surface of the substrate are provided as the active layers.

According to the present embodiment, the In composition ratio of the second n-InGaAs layer 33b on an upper side which forms the active layer is continuously decreased upward. Consequently, when forming the active layers, crystallinity of each n-InGaAs layer can be enhanced more than in the active layers in the conventional field effect transistor.

It is easy to continuously change the In composition ratio of the second n-InGaAs layer 33b by a MBE method. Consequently, a characteristic of the field effect transistor is not deteriorated. However, it is desirable that a maximum value of the In composition ratio of the second n-InGaAs layer 33b should be smaller than the In composition ratio of the first n-InGaAs layer 33a.

(Fourth Embodiment)

Figure 4:
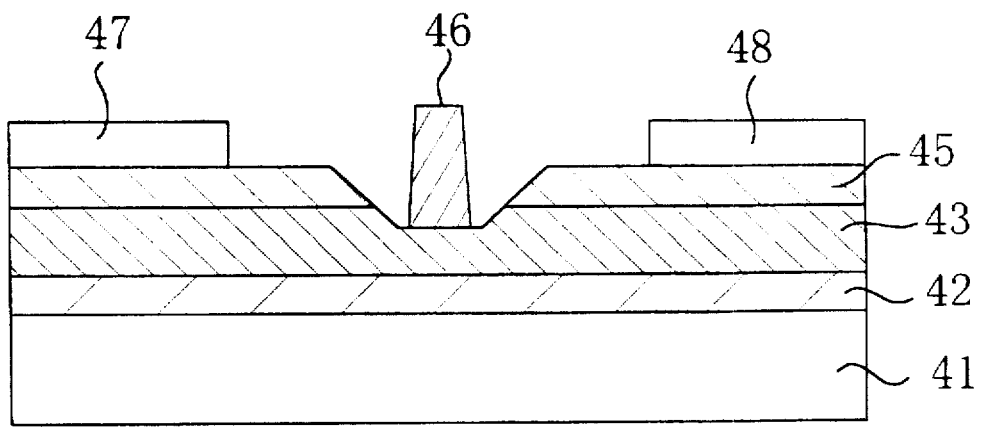
FIG. 4 is a sectional view showing a field effect transistor according to a fourth embodiment.

FIG. 4 is a sectional view showing a field effect transistor according to a fourth embodiment. In FIG. 4, the reference numeral 41 denotes a semi-insulating GaAs substrate, the reference numeral 42 denotes an Undope-GaAs layer having a thickness of 700 nm as a buffer layer, and the reference numeral 43 denotes an n-InGaAs layer having a carrier concentration of $8 \times 10^{17}$ cm$^{-3}$, a thickness of 30 nm and an In composition ratio which is changed from 0.2 to 0.01 toward a surface of the substrate. An active layer is formed by the n-InGaAs layer 43. The reference numeral 45 denotes an N$^+$ type GaAs layer having a carrier concentration of about $4 \times 10^{18}$ cm$^{-3}$ and a thickness of 50 nm as a contact layer, the reference numeral 46 denotes a gate electrode, the reference numeral 47 denotes a source electrode, and the reference numeral 48 denotes a drain electrode.

The field effect transistor according to the present embodiment is characterized in that the n-InGaAs layer 43 having the In composition ratio continuously changed from 0.2 to 0.01 toward the surface of the substrate is provided as the active layer.

According to the present embodiment, the active layer is formed by the single n-InGaAs layer 43, and the In composition ratio of the n-InGaAs layer 43 is continuously decreased upward. Consequently, when forming the active layer, crystallinity of the n-InGaAs layer can be enhanced more than in the active layers in the conventional field effect transistor.

(Fifth Embodiment)

Figure 13:
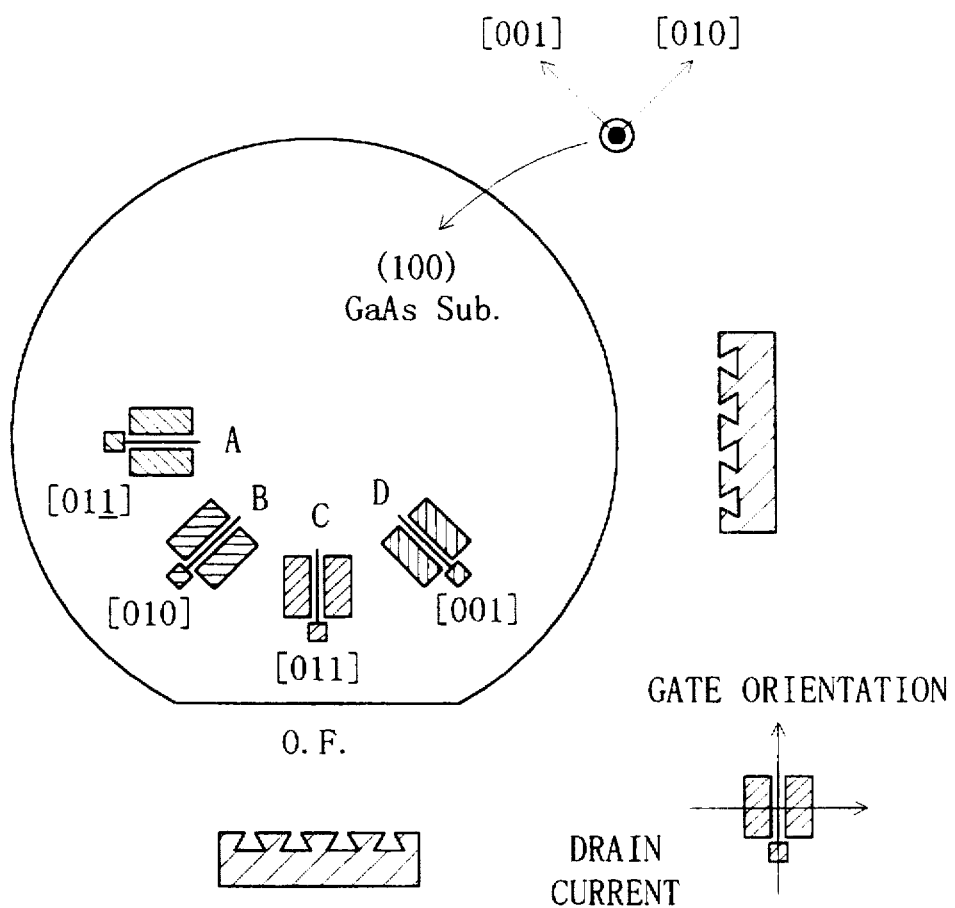
FIG. 13 is a diagram for defining a relationship between a crystal orientation in each portion of a wafer and a gate orientation of the field effect transistor.
Figure 14:
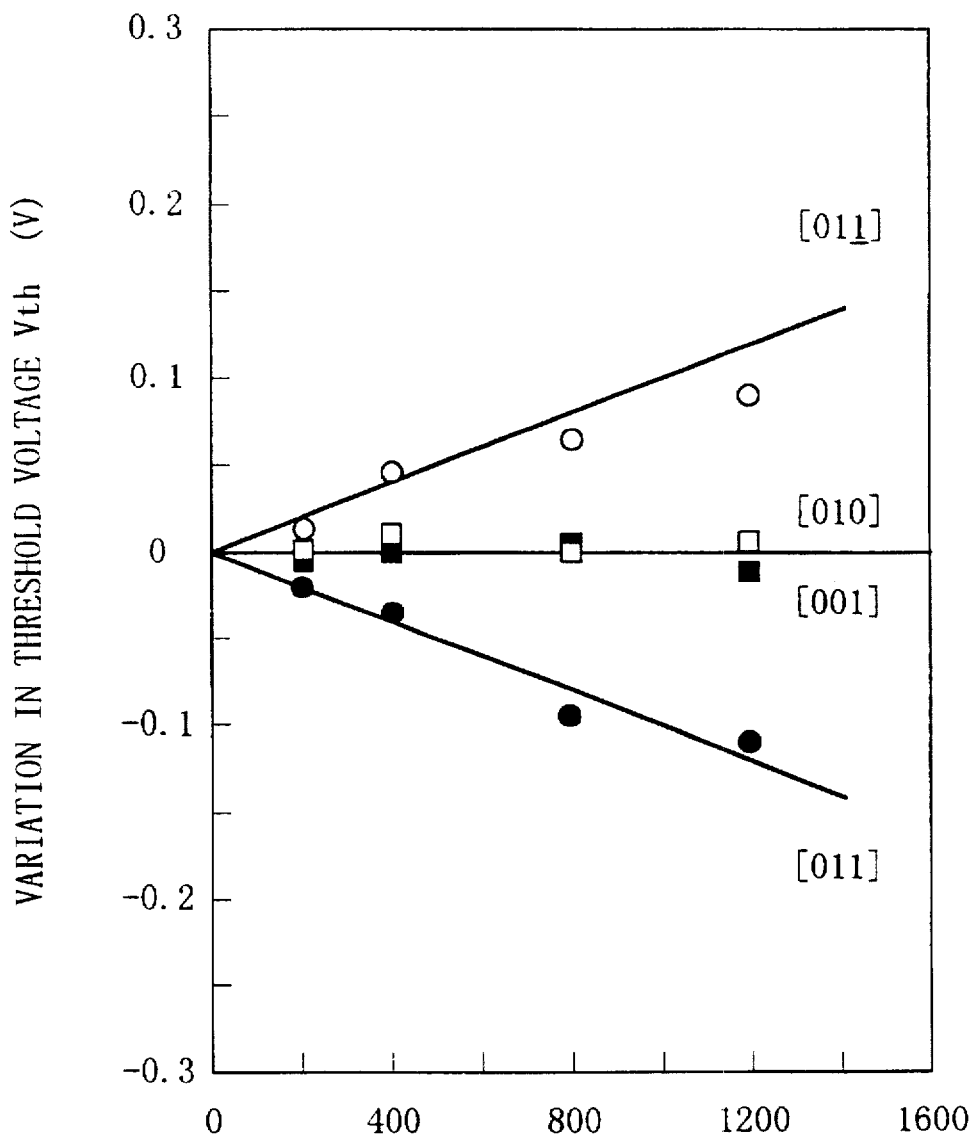
FIG. 14 is a chart showing a relationship between a thickness of a general dielectric film and a variation in a threshold voltage of the field effect transistor.

While a structure of a field effect transistor according to a fifth embodiment is not shown, a direction which is parallel with each of long sides of the gate electrodes 16 to 46 according to the first to fourth embodiments shown in FIGS. 1 to 4, that is, a gate orientation defined in FIG. 13 is set to a direction [010] or [001].

Figure 9:
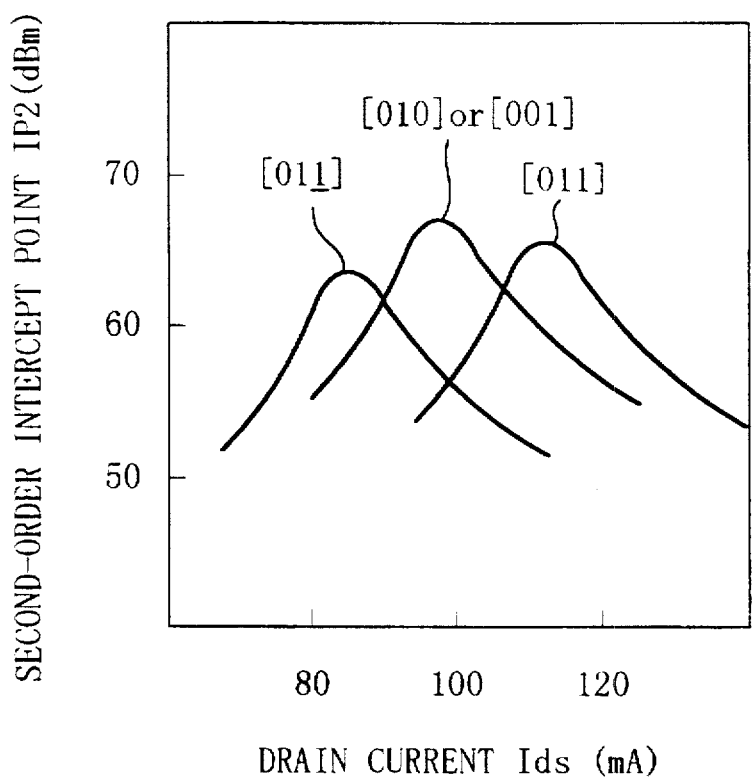
FIG. 9 is a chart showing a dependence characteristic, on a drain current, of IP2 in a gate orientation of each of the field effect transistors according to the fifth embodiment and the prior art.
Figure 10:
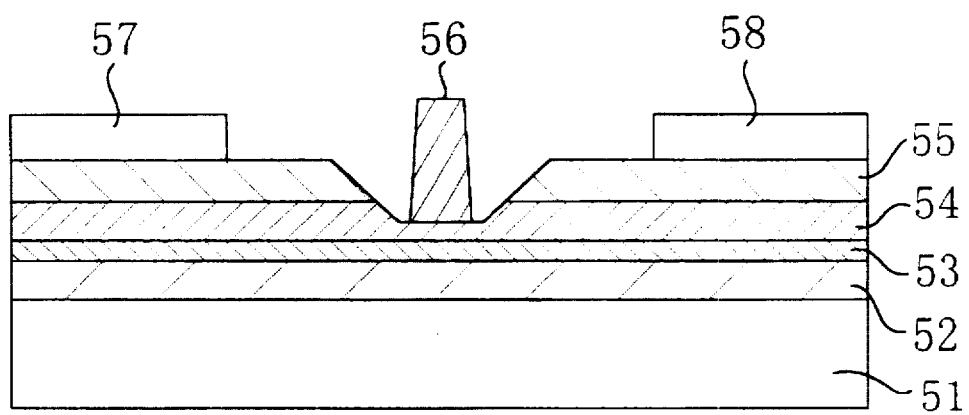
FIG. 10 is a sectional view showing an n-InGaAs/n-GaAs field effect transistor according to the prior art.
Figure 11:
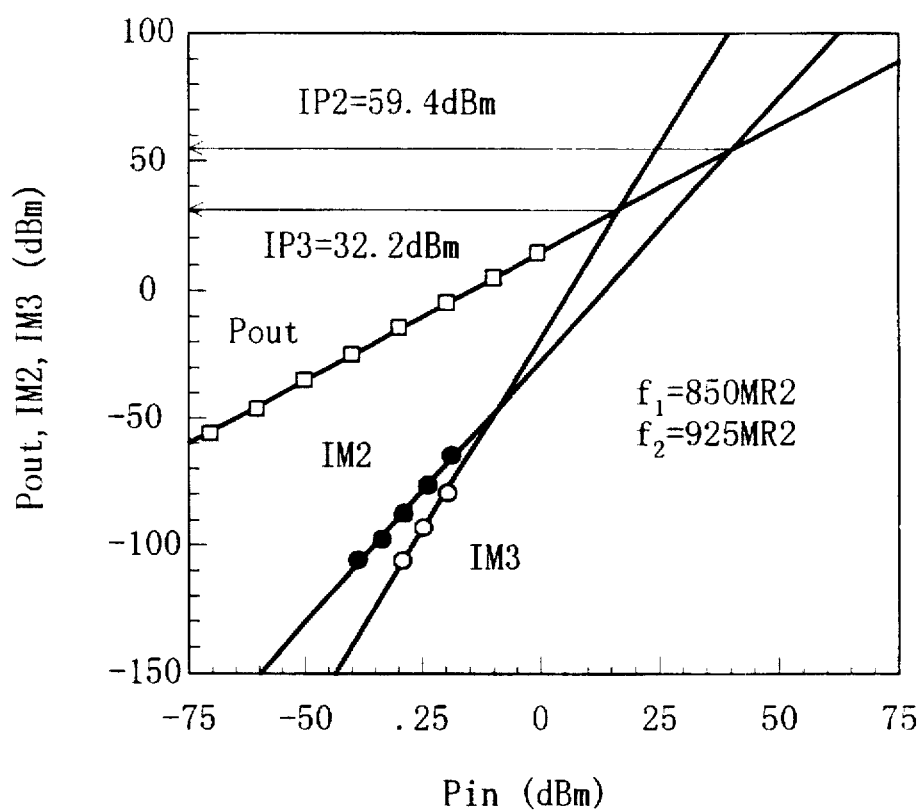
FIG. 11 is a chart showing a distortion characteristic of the field effect transistor according to the prior art.
Figure 12:
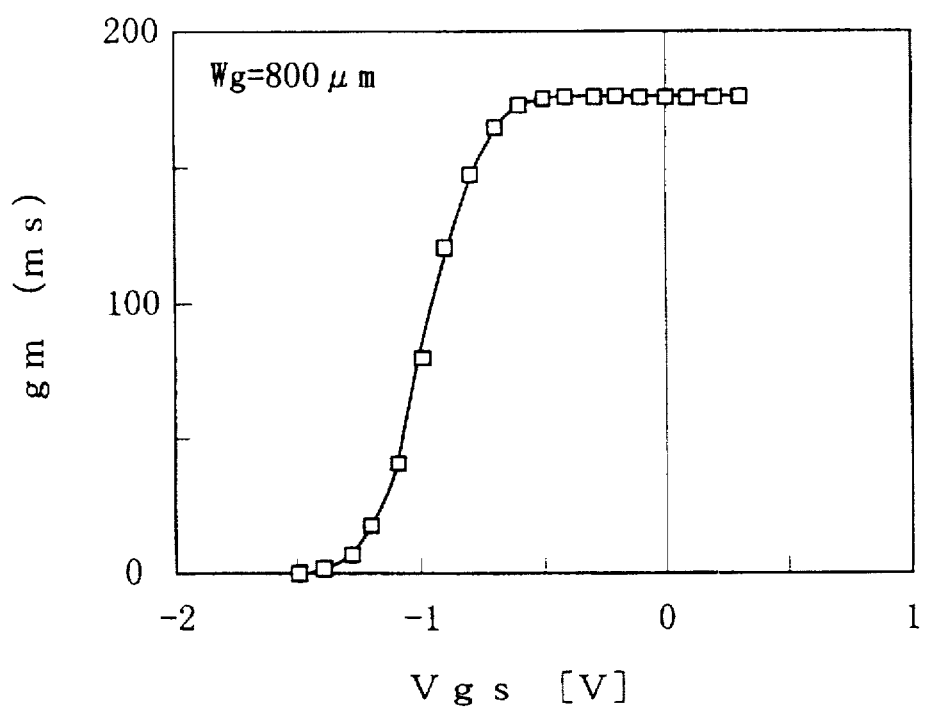
FIG. 12 is a chart showing dependence of a transconductance gm on a gate voltage of the field effect transistor according to the prior art.

FIG. 9 is a chart showing dependence, on a drain current, of a distortion characteristic of the field effect transistor according to the fifth embodiment. In FIG. 9, an axis of abscissa indicates a drain current Ids of the field effect transistor, and an axis of ordinate indicates a kind of a second-order intercept point IP2. A stress of a dielectric film (passivation film) is compressive.

As is apparent from FIG. 9, in the case where the gate orientation of the field effect transistor is set to a direction [011] or [01$\bar{1}$] as in the prior art, an electric characteristic (a Vgs-Ids characteristic or the like) of the field effect transistor is varied by a piezo electric effect and the drain current Ids which gives a peak of IP2 is moved. On the other hand, if the gate orientation of the field effect transistor is set to the direction [010] or [001] according to the present embodiment, it is apparent that the drain current Ids which gives the peak of IP2 is not varied because it is not affected by the piezo electric effect so that an excellent distortion characteristic can be displayed with good reproducibility. According to the present invention, the field effect transistor having a super low distortion characteristic can be manufactured with good reproducibility.

While the In composition ratio of the n-InGaAs layer has been set to 0.2 or less in each embodiment, the present invention is not restricted thereto. When forming the n-InGaAs layer on a buffer layer comprising GaAs, it is necessary to keep a critical thickness of the n-InGaAs layer great such that electron can run at a high speed. Consequently, it is preferable that the In composition ratio of the n-InGaAs layer should be 0.25 or less.

It is preferable that the In composition ratio of the n-InGaAs layer should be 0.01 or more. If the In composition ratio is less than 0.01, there is a possibility that epitaxial growth of the n-InGaAs layer might not be performed smoothly by a MBE method.

While the embodiments have been described by using the GaAs substrate having the principal plane (100), it is needless to say that combinations of other principal planes of substrates and other gate orientations which are not affected by the piezo electric effect are also effective. With such a structure, a variation in an electric characteristic of the field effect transistor is prevented from being caused by the piezo electric effect due to the stress generated between the GaAs substrate and the dielectric film. Consequently, the field effect transistor having a super low distortion characteristic can be manufactured with good reproducibility.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

We claim:

1. A field effect transistor, comprising:

a substrate;

a buffer layer formed on the substrate by epitaxial growth;

an active layer formed on the buffer layer, in which an operating current is to flow;

a gate electrode formed on or above the active layer; and source-drain formed in regions located at both sides of the gate electrode above the substrate and connected to both ends of the active layer, the active layer including:

an n-In$_a$Ga$_{1-a}$As layer formed on the buffer layer and having an In composition ratio a (0<a<1); and an n-In$_b$Ga$_{1-b}$As layer formed on the n-In$_a$Ga$_{1-a}$As layer and having an In composition ratio b (0<b<a).

2. The field effect transistor of claim 1, wherein the In composition ratio a of the n-In$_a$Ga$_{1-a}$As layer is 0.01 or more, and the In composition ratio b of the n-In$_b$Ga$_{1-b}$As layer is 0.25 or less.

3. A field effect transistor, comprising:

a semi-insulating GaAs substrate;

a buffer layer formed on the semi-insulating GaAs substrate by epitaxial growth;

an active layer formed on the buffer layer, in which an operating current is to flow;

a gate electrode formed on or above the active layer; and source/drain electrode formed in regions located at both sides of the gate electrode above the semi-insulating GaAs substrate and connected to both ends of the active layer, wherein the active layer is formed by three or more n-In$_x$Ga$_{1-x}$As layers, the n-In$_x$Ga$_{1-x}$As layers having In composition ratios x (0<x<1) which are different from each other such that the n-In$_x$Ga$_{1-x}$As layers located on upper sides have the In composition ratios x decreased.

4. The field effect transistor of claim 3, wherein the In composition ratio x of the n-In$_x$Ga$_{1-x}$As layer is 0.01 or more and 0.25 or less.

5. A field effect transistor, comprising:

a substrate;

a buffer layer formed on the substrate by epitaxial growth;

an active layer formed on the buffer layer, in which an operating current is to flow;

a gate electrode formed on or above the active layer; and source/drain electrode formed in regions located at both sides of the gate electrode above the substrate and connected to both ends of the active layer, the active layer including:

an n-In$_a$Ga$_{1-a}$As layer formed on the buffer layer and having an In composition ratio a (0<a<1); and an n-In$_x$Ga$_{1-x}$As layer formed on the n-In$_a$Ga$_{1-a}$As layer and having an In composition ratio x (0<x<a) changed to be continuously decreased upward.

6. The field effect transistor of claim 5, wherein the In composition ratio a of the n-In$_a$Ga$_{1-a}$As layer is 0.01 or more, and the In composition ratio x of the n-In$_x$Ga$_{1-x}$As layer is 0.25 or less.

7. A field effect transistor, comprising:

a semi-insulating GaAs substrate;

a buffer layer formed on the semi-insulating GaAs substrate by epitaxial growth;

an active layer formed on the buffer layer, in which an operating current is to flow;

a gate electrode formed on or above the active layer; and source/drain electrode formed in regions located at both sides of the gate electrode above the semi-insulating GaAs substrate and connected to both ends of the active layer, wherein the active layer is formed by an n-In$_x$Ga$_{1-x}$As layer having an In composition ratio x (0<x<1) changed to be continuously decreased upward.

8. The field effect transistor of claim 7, wherein the In composition ratio of the n-In$_x$Ga$_{1-x}$As layer is 0.01 or more and 0.25 or less.

9. The field effect transistor of claim 1, wherein a plane of the active layer which is parallel with an upper face of the substrate is a plane (100), and a direction in which the operating current flows in the active layer is a direction [010] or [001].

10. The field effect transistor of claim 9, wherein a cross-sectional shape of the gate electrode is a rectangle having a long side and a short side, and the long side of the gate electrode is orthogonal to the direction in which the operating current flows in the active layer.

11. The field effect transistor of claim 3, wherein a plane of the active layer which is parallel with an upper face of the substrate is a plane (100), and a direction in which the operating current flows in the active layer is a direction [010] or [001].

12. The field effect transistor of claim 5, wherein a plane of the active layer which is parallel with an upper face of the substrate is a plane (100), and a direction in which the operating current flows in the active layer is a direction [010] or [001].

13. The field effect transistor of claim 7, wherein a plane of the active layer which is parallel with an upper face of the substrate is a plane (100), and a direction in which the operating current flows in the active layer is a direction [010] or [001].

* * * * *